United States Patent [19]

Ikeda

[11] Patent Number: 5,898,348
[45] Date of Patent: Apr. 27, 1999

[54] PIEZOELECTRIC RESONATOR HAVING SPECIFIC LEAD LINE ARRANGEMENTS AND METHOD OF MANUFACTURING SAME

[75] Inventor: Yoshihiro Ikeda, Himi, Japan

[73] Assignee: Murata Manufacturing Co., Ltd., Kyoto-fu, Japan

[21] Appl. No.: 09/076,530

[22] Filed: May 12, 1998

[30] Foreign Application Priority Data

May 19, 1997 [JP] Japan .................. 9-128782

[51] Int. Cl.$^6$ ..................... H03H 9/205; H03H 9/56
[52] U.S. Cl. .................. 333/191; 310/366; 310/357; 310/333; 29/25.35
[58] Field of Search .................. 333/187–192; 310/321, 357, 365–368, 318, 319, 333; 29/25.35

[56] References Cited

U.S. PATENT DOCUMENTS

| | | | |
|---|---|---|---|
| 5,350,965 | 9/1994 | Noto et al. ........................ | 310/366 |
| 5,446,429 | 8/1995 | Tanaka ............................. | 333/187 |
| 5,608,362 | 3/1997 | Nishimura et al. ................ | 333/191 |
| 5,815,053 | 9/1998 | Futakuchi ......................... | 333/191 |

FOREIGN PATENT DOCUMENTS

| | | | |
|---|---|---|---|
| 55-149520 | 11/1980 | Japan ............................... | 333/191 |
| 63-172512 | 7/1988 | Japan ............................... | 333/187 |
| 4-115706 | 4/1992 | Japan ............................... | 333/187 |

*Primary Examiner*—Benny Lee
*Assistant Examiner*—Barbara Summons
*Attorney, Agent, or Firm*—Graham & James LLP

[57] ABSTRACT

A piezoelectric resonator having excellent filter characteristics and effectively suppressing unnecessary ripples and/or spurious components includes first and second excitation electrodes disposed on a first major surface of a piezoelectric substrate, a first common electrode on a second major surface so as to oppose the first and second excitation electrodes with the substrate being located therebetween, and two lead lines extending along portions of longitudinal edges of the piezoelectric substrate. An excitation-lead line is connected to the first and second excitation electrodes which partly overlap a ground-terminal electrode provided on the lower surface with the piezoelectric substrate located therebetween.

20 Claims, 9 Drawing Sheets

PIEZOELECTRIC RESONATOR HAVING SPECIFIC LEAD LINE ARRANGEMENTS AND METHOD OF MANUFACTURING SAME

BACKGROUND OF THE INVENTION

1. Field of the Invention

The present invention relates generally to piezoelectric resonators adapted for use in audio filter circuits of television (TV) receivers, for example, and a method of manufacturing such piezoelectric resonators. More particularly, the present invention relates to piezoelectric resonators constructed to suppress unnecessary vibrations by controlling positions of excitation-lead lines connected to excitation electrodes and a method of manufacturing such piezoelectric resonators.

2. Description of the Related Art

In audio filter circuits of TV receivers or similar devices, various types of piezoelectric resonators are used as frequency band filters.

FIG. 14 is a diagram showing a plan view of one example of such a piezoelectric resonator.

A piezoelectric resonator 51 includes a substantially rectangular elongated piezoelectric substrate 52. The piezoelectric substrate 52 is made of lead zirconate titanate piezoelectric ceramics or other suitable material and is polarized in a direction as designated by arrow "P" in FIG. 14.

The piezoelectric substrate 52 has an upper or top surface on which first and second excitation electrodes 53a, 53b are provided so as to be spaced apart from each other with a gap defined between them, and on which third and fourth excitation electrodes 54a, 54b are also provided at locations spaced by a predetermined distance from the first and second excitation electrodes 53a, 53b with a gap defined therebetween.

The first excitation electrode 53a is electrically connected via an excitation-lead line 55a to a terminal electrode 56. The second excitation electrode 53b and the third excitation electrode 54a are connected together by an excitation-lead line 55b. The fourth excitation electrode 54b is electrically connected to a terminal electrode 57 via an excitation-lead line 55c.

On the lower or bottom surface of the piezoelectric substrate 52, a common electrode 58 is arranged opposite to the first and second excitation electrodes 53a, 53b in the so-called "top/bottom-surface overlap" manner. The common electrode 58 and certain associative electrodes and lead lines to be described later have contours which are shown via dotted lines in FIG. 14. While the common electrode 58 is illustrated such that it appears larger than the region resulting from projection of the first and second excitation electrodes 53a, 53b onto the bottom surface for purposes of visual clarification of its contour shape or "phantom" depicted by dotted lines, the common electrode 58 is actually designed to have a size or configuration along the outline of the region resulting from such downward projection of the excitation electrodes 53a, 53b. Note that in the drawings of the present application, any lead lines and common electrode to be provided on the bottom surface are depicted such that the size of each is virtually larger than its real size for purposes of clarification of the outer shape illustrated via dotted lines.

The common electrode 58 is electrically connected by a ground-lead line 59a to a ground-terminal electrode 60. A ground-lead line 59b is connected to the opposite side of the ground-terminal electrode 60 in such a way that the ground-lead line 59b is connected to the second common electrode 61 which is arranged opposite to the third and fourth excitation electrodes 54a, 54b in the top/bottom-surface overlap manner.

In the piezoelectric resonator 51, the first and second excitation electrodes 53a, 53b and the associated common electrode 58 defines a first filter section and the excitation electrodes 54a, 54b and the second common electrode 61 define a second filter section. Upon application of an input signal to the terminal electrode 56, the first and second filter sections begin vibrating so that an output signal is derived from the terminal electrode 57.

Due to use of the piezoelectric effect, the first and second filter sections must be designed to vibrate in the manner described above. For other parts of the resonator 51, it is desirable that any unwanted vibration is hardly generated.

On the contrary, with the piezoelectric resonator 51, the excitation-lead line 55b and the ground-terminal electrode 60 are designed so as to overlap each other with the piezoelectric substrate 52 located therebetween. In addition, since a potential difference can occur between the excitation-lead line 55b and ground-terminal electrode 60, a part of the resonator 51 at which the excitation-lead line 55b and the ground-terminal electrode 60 are located exhibits resonance resulting in generation of unnecessary vibration components. Similarly, unnecessary vibrations can also be generated at portions where the excitation-lead line 55b and the bottom-surface ground-lead lines 59a, 59b overlap each other.

In piezoelectric resonators, it has been well known that it is desirable to arrange lead lines other than electrodes constituting the common part so that such lead lines do not overlap with the top and bottom surfaces of the piezoelectric substrate.

However, in the piezoelectric resonator 51, merely arranging the excitation-lead line 55b and ground-lead lines 59a, 59b so that they do not overlap with each other would result in an increase in unnecessary vibration. Also, in piezoelectric resonators used as band filters and having a center frequency ranging from 5 to 8 MHz, it is still difficult to sufficiently suppress the occurrence of ripples or spurious vibration components.

SUMMARY OF THE INVENTION

To overcome the problems described above, preferred embodiments of the present invention provide a piezoelectric resonator which is capable of effectively suppressing generation of unnecessary ripples and spurious components otherwise occurring depending upon the position of an excitation-lead line thereby achieving excellent filter characteristics.

According to preferred embodiments of the present invention, a piezoelectric resonator and a method of manufacturing a piezoelectric resonator is provided such that the resonator includes an excitation-lead line and a ground-lead line as well as a ground-terminal electrode connected to a common part having first and second excitation electrodes and a common electrode.

More specifically, a piezoelectric resonator according to preferred embodiments of the present invention includes a piezoelectric substrate; first and second excitation electrodes provided on a first major surface of the piezoelectric substrate with a gap defined therebetween; first and second excitation-lead lines connected to the second excitation electrode and provided along portions of both longitudinal edges of the piezoelectric substrate, respectively; a first common electrode provided on a second major surface of the piezoelectric substrate and disposed opposite to the first and second excitation electrodes with the piezoelectric substrate located therebetween; a first ground-lead line connected to the first common electrode; and a ground-terminal electrode provided on the second major surface of the piezoelectric substrate and connected to the first ground-lead line and disposed opposite to the excitation-lead line with the piezoelectric substrate located therebetween.

According to the above described piezoelectric resonator of preferred embodiments of the present invention, because the first and second lead lines are arranged to extend along a portion of the longitudinal edges of the piezoelectric substrate, it is possible to effectively suppress unnecessary ripples otherwise occurring in the attenuation-characteristics caused by vibration of the excitation-lead lines.

In addition, since the excitation-lead line includes first and second excitation-lead lines, the overlap area with the ground-terminal electrode is at least doubly increased resulting in an increase in coupling capacitance, which generates improvement of the shape factor of filter waveforms. This makes it possible to provide piezoelectric resonators having superior filter characteristics.

In the above described piezoelectric resonator, third and fourth excitation electrodes may be provided on the first major surface of the piezoelectric substrate with a gap defined therebetween and with a predetermined distance from the first and second excitation electrodes; a second common electrode may be provided on the second major surface of the piezoelectric substrate and arranged opposite to the third and fourth excitation electrodes with the piezoelectric substrate located therebetween; the second and third excitation electrodes may be connected to each other via the first and second excitation-lead lines on the first major surface of the piezoelectric substrate; and the second common electrode may be connected to the ground-terminal electrode via a second ground-lead line.

The above described piezoelectric resonator further includes a second common electrode which is arranged to be spaced apart from the first and second excitation electrodes and disposed opposite to the third and fourth excitation electrodes in the so-called top/bottom-surface overlap manner. Therefore, in the piezoelectric filter having a plurality of resonance sections provided therein, any unnecessary ripples caused by vibration of excitation-lead lines are effectively suppressed while simultaneously improving the shape factor of filter waveforms achieved by an increase in coupling capacitance due to one of the excitation-lead lines which partly overlaps the ground-terminal electrode in a way described above is arranged to have first and second excitation-lead lines extending along at least a portion of the longitudinal edges of the piezoelectric substrate.

The preferred embodiments of the present invention also provides a method of manufacturing the above described piezoelectric resonator, comprising the steps of: preparing a mother plate including a plurality of piezoelectric substrates; providing first and second excitation electrodes, first and second excitation-lead lines, a first common electrode, a first ground-lead line, and a ground-terminal electrode on each of the piezoelectric substrates; and cutting the mother plate on the excitation-lead lines on the mother plate and along a direction of a length of the excitation-lead lines at a pitch substantially identical to a pitch of the excitation-lead lines.

According to the above described method, since the step after preparation of the mother plate is to simply cut the mother plate into portions at substantially the same pitch as an excitation-lead line pitch and also along the width dimension of the excitation-lead lines, it is possible to easily and reliably provide the above described piezoelectric resonators.

The preferred embodiments of the present invention further provides a piezoelectric resonator including a substantially rectangular piezoelectric substrate; first and second excitation electrodes provided on a first major surface of the piezoelectric substrate with a gap defined therebetween; an excitation-lead line connected to the second excitation electrode and extending in a direction substantially parallel to a length direction of the piezoelectric substrate; a first common electrode provided on a second major surface of the piezoelectric substrate and arranged opposite to the first and second excitation electrodes via the piezoelectric substrate; a first ground-lead line connected to the first common electrode; a ground-terminal electrode connected to the first ground-lead line and arranged opposite to the excitation-lead line via the piezoelectric substrate; and the expressions "$0 \leq a \leq W/4$" and "$b \geq (3/2)t$" being satisfied where "W" is a width of the piezoelectric substrate, "t" is a thickness of the piezoelectric substrate, "a" is a distance from a longitudinal edge of the piezoelectric substrate to the excitation-lead line, and "b" is a distance between the excitation-lead line and the ground-lead line when viewed at right angles relative to a plane corresponding to the substrate surface.

According to the above described piezoelectric resonator, since the piezoelectric substrate dimensions and excitation-lead line positions as well as the ground-lead line locations are specifically set to satisfy the above described expressions (1) and (2), it is possible to force unnecessary spurious components occurring in filter characteristics to be located far from the pass band while at the same time effectively reducing such spurious components, which in turn provides a piezoelectric resonator having excellent filter characteristics.

In the above described piezoelectric resonator, third and fourth excitation electrodes may be provided on the first major surface of the piezoelectric substrate with a gap defined therebetween and with a predetermined distance from the first and second excitation electrodes; a second common electrode may be provided on the second major surface of the piezoelectric substrate and arranged opposite to the third and fourth excitation electrodes via the piezoelectric substrate; the second and third excitation electrodes may be connected to each other via the first and second excitation-lead lines on the first major surface of the piezoelectric substrate; and the second common electrode may be connected to the ground-terminal electrode via a second ground-lead line.

Also the above described piezoelectric resonator includes a second common electrode which is spaced apart from the first and second excitation electrodes and opposite to the third and fourth excitation electrodes in the so-called top/bottom-surface overlap manner. Therefore, in the piezoelectric filter with multiple resonance sections provided therein, the excitation-lead lines are designed to satisfy the above described expressions (1) and (2). As a result, unnecessary spurious components occurring in filter characteristics are moved far from the pass band as in the above described piezoelectric resonator while effectively reducing the intensity of spurious components.

Other features and advantages of preferred embodiments of the present invention will become apparent from the following description of the invention which refers to the accompanying drawings.

DETAILED DESCRIPTION OF PREFERRED EMBODIMENTS

Figure 1:
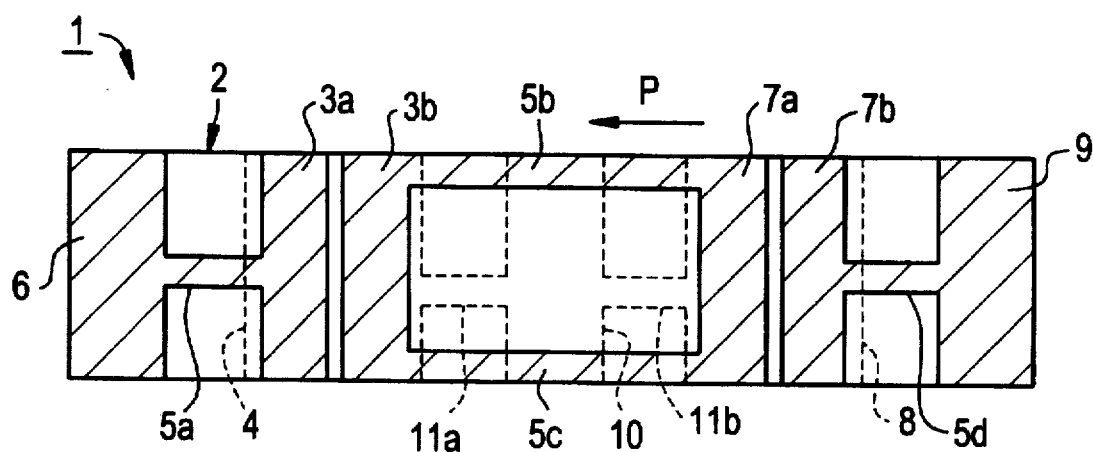
FIG. 1 is a diagram showing a plan view of a piezoelectric resonator in accordance with a first preferred embodiment of the present invention.

FIG. 1 is a diagram showing a plan view of a piezoelectric resonator in accordance with a first preferred embodiment of the present invention.

A piezoelectric resonator 1 preferably includes a substantially rectangular elongated piezoelectric substrate 2. The piezoelectric substrate 2 is preferably made of piezoelectric ceramics such as, for example, lead zirconate titanate piezoelectric ceramics, and is polarized in a direction along the length thereof as designated by arrow P in FIG. 1. Note here that the piezoelectric substrate 2 may alternatively be made of piezoelectric single-crystals such as quartz, $LiTaO_3$ or suitable material other than the piezoelectric ceramics.

On the top surface (first major surface) of the piezoelectric substrate 2, first and second excitation electrodes 3a, 3b are arranged so as to be spaced by a gap between the electrodes 3a, 3b. A first common electrode 4 is provided on the opposite surface, i.e. bottom surface, of piezoelectric substrate 2 in a manner such that the first common electrode 4 is opposite to the excitation electrodes 3a, 3b with piezoelectric substrate 2 located therebetween in the so-called "top/bottom-surface overlap" arrangement. The excitation electrodes 3a, 3b and the first common electrode 4 constitute a first resonance section utilizing the slide or "shear" vibration mode.

An excitation-lead line 5a is connected to the first excitation electrode 3a. The excitation-lead line 5a is electrically connected to a terminal electrode 6 provided on one end of the piezoelectric substrate 2 in the length direction thereof. Excitation lead lines 5b, 5c are connected to the second excitation electrode 3b. The excitation-lead lines 5b, 5c are arranged to extend along portions of both longitudinal edges of the piezoelectric substrate 2.

Third and fourth excitation electrodes 7a, 7b are arranged so that the electrodes 7a, 7b are spaced apart from each other via a gap and are spaced from the first and second excitation electrodes 3a, 3b by a specified distance. A second common electrode 8 is arranged to be opposite to the third and fourth excitation electrodes 7a, 7b with the piezoelectric substrate 2 located therebetween in the so-called "top/bottom-surface overlap" fashion. The third and fourth excitation electrodes 7a, 7b and the second common electrode 8 constitute a second resonance section.

The excitation-lead lines 5b, 5c are connected to the third resonance electrode 7a. An excitation-lead line 5d is connected to the fourth resonance electrode 7b. The other end of the excitation-lead line 5d is electrically connected to a terminal electrode 9 which is provided at the other end edge of the piezoelectric substrate 2 in the length direction thereof.

On the bottom surface (second major surface) of the piezoelectric substrate 2, a ground-terminal electrode 10 is located at a central region between the first common electrode 4 and the second common electrode 8. The ground-terminal electrode 10 is arranged to extend to both ends of the piezoelectric substrate 2 in the width direction thereof so that electrode 10 partly overlaps the excitation-lead lines 5b, 5c.

The ground-terminal electrode 10 is electrically connected via ground-lead lines 11a, 11b to the common electrodes 4, 8, respectively.

Upon application of an input signal to the terminal electrode 6, the first and second resonance sections are excited so as to vibrate thereby allowing an output signal to be output at the terminal electrode 9. In this case, with the piezoelectric resonator 1 of this preferred embodiment, all unnecessary ripples are effectively suppressed because of the fact that the excitation-lead lines 5b, 5c which overlap the ground-terminal electrode 10 are provided along portions of the longitudinal edges of the piezoelectric substrate 2, respectively. This will be explained in detail in conjunction with practical examples of preferred embodiments described below.

A filter having a center frequency of about 6.5 MHz was prepared as an example of the piezoelectric resonator 1 according to preferred embodiments of the present invention by forming the various types of electrodes and lead lines made of Ag on the piezoelectric substrate 2 made of lead zirconate titanate piezoelectric ceramics. The dimensions of the piezoelectric substrate 2 in this example measured about 8 mm in length, about 1.2 mm in width, and about 0.18 mm in thickness. The area of each of the first and second excitation electrodes 3a, 3b and the third and fourth excitation electrodes 7a, 7b was set at about 5 $mm^2$.

Figure 14:
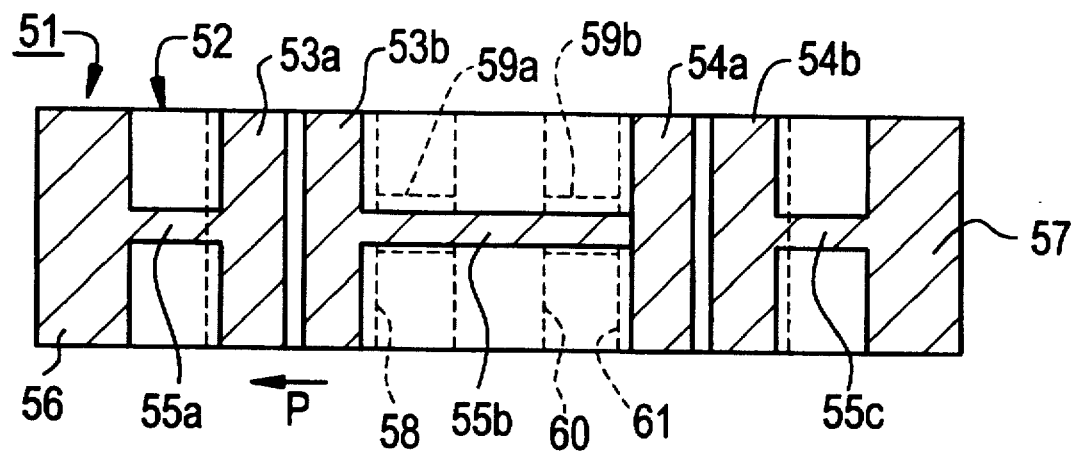
FIG. 14 is a diagram showing one example of a prior art piezoelectric resonator.

For comparison purposes, another filter having a center frequency of about 6.5 MHz was also prepared according to the prior art construction, which may be similar to the above piezoelectric resonator 1 except that the excitation-lead line 55b was arranged at a location near the center of the piezoelectric substrate 2 in the width direction thereof in accordance with the structure of the resonator shown in FIG. 14.

The attenuation amount versus frequency characteristics of the prior art and the example of the preferred embodiments prepared as described above are shown in FIGS. 2 and 3, respectively.

Figure 2:
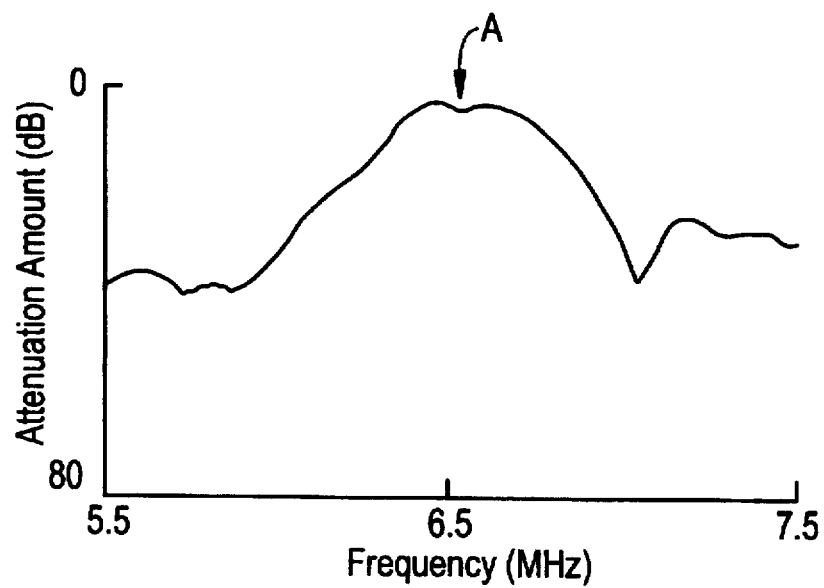
FIG. 2 is a diagram showing an attenuation versus frequency characteristic of a prior art piezoelectric resonator for comparison to the preferred embodiments of the present invention.

As apparent from FIG. 2, in the prior art piezoelectric resonator, ripples are generated as indicated by arrow "A". In contrast, no ripples were generated in the attenuation versus frequency characteristic of the preferred embodiment shown in FIG. 3.

Figure 3:
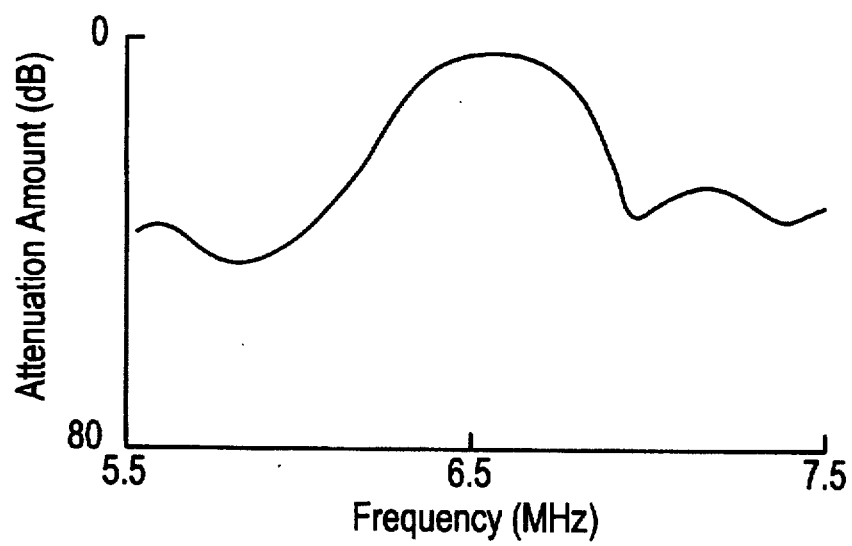
FIG. 3 is a diagram showing an attenuation-frequency characteristic of the piezoelectric resonator in accordance with the first preferred embodiment.

Accordingly, it is easily understood from comparison of FIGS. 2 and 3 that the preferred embodiment having the arrangement of the excitation-lead lines 5b, 5c so as to partly overlap the ground-terminal electrode 10 provided along portions of the longitudinal edges of the piezoelectric substrate 2 prevents generation of pass-through band ripples while simultaneously enabling the amount of attenuation to increase in regions near the pass band.

It can also be seen in FIG. 2 that the attenuation amount in the regions near the pass band is less while the waveform is irregular at certain portions other than the ripple indicated by arrow A. In contrast, with this preferred embodiment, the attenuation amount near the pass band remains significant while rendering the waveform near the pass band smooth thus offering an improvement of what is called the "shape factor" as shown in FIG. 3.

Ten thousands of piezoelectric resonators were manufactured in accordance with the prior art and the preferred embodiment shown in FIG. 1, for evaluation of the rejection rate under the assumption that resonators having ripples designated by arrow A of the magnitude that are equal to or greater than 1.0 dB in attenuation amount are regarded as defective products. The results of the evaluation were that the prior art design had a 10% rejection rate whereas the piezoelectric resonators constructed according to a preferred embodiment of the present invention had a far superior rejection rate of 0%.

The ability to suppress ripples near the center frequency by arranging the excitation-lead lines 5b, 5c to be elongated along portions of the longitudinal edges of the piezoelectric substrate 2 is achieved because the affect caused by vibration of the excitation-lead lines 5b, 5c does not specifically influence the pass band and its nearby waveform negatively. Also, because the preferred embodiment has two lead lines of the excitation-lead lines 5b, 5c which causes the overlap area of the excitation-lead lines and the ground-terminal electrode 10 to be at least twice the overlap area of the prior art, the coupling capacitance significantly increases to thereby improve the shape factor in the filter characteristics accordingly.

Figure 4:
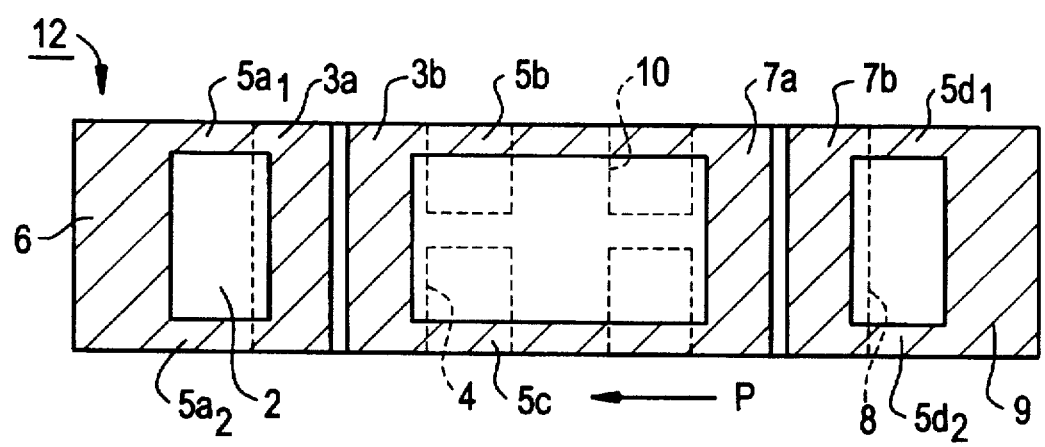
FIG. 4 is a plan diagram for explanation of the piezoelectric resonator in accordance with the first preferred embodiment.

FIG. 4 is a diagram showing a plan view of one possible modification of the piezoelectric resonator in accordance with the first preferred embodiment of the present invention. The piezoelectric resonator shown in FIG. 1 was such that the excitation-lead lines 5b, 5c are respectively provided along portions of the longitudinal edges of the piezoelectric substrate 2 while the remaining excitation-lead lines 5a, 5d which do not overlap the ground-terminal electrode 10 are disposed at the center portion in the width direction of the piezoelectric substrate 2. However, as in the modification shown in FIG. 4, such respective excitation-lead lines connected to the first and fourth excitation electrodes 3a, 7b may also be arranged so that the electrodes 3a, 7b extend along portions of respective longitudinal edges of the piezoelectric substrate 2. More specifically, in the piezoelectric resonator 12 shown in FIG. 4, the first excitation electrode 3a and the terminal electrode 6 are connected by excitation-lead lines $5a_1$, $5a_2$ provided along portions of the longitudinal edges of the piezoelectric substrate 2 while simultaneously the fourth excitation electrode 7b and the terminal electrode 9 are connected by excitation-lead lines $5d_1$, $5d_2$ arranged to extend along portions of the longitudinal edges of the piezoelectric substrate 2.

In the piezoelectric resonator 12 also, the excitation-lead lines 5b, 5c are arranged to extend along portions of the longitudinal edges of the piezoelectric substrate 2 in the same manner as in the piezoelectric resonator 1 of the first preferred embodiment. Therefore, it is possible to suppress ripples within the pass band in the same way as achieved by the piezoelectric resonator 1 of the first preferred embodiment, which in turn enables the shape factor of the filter characteristics to be improved accordingly. In addition, the excitation-lead lines $5a_1$, $5a_2$, $5d_1$, $5d_2$ are also arranged along portions of the longitudinal edges of the piezoelectric substrate 2 thereby making it possible to readily perform patterning processes during fabrication of one or more electrodes on the top surface of the piezoelectric substrate 2.

Figure 5:
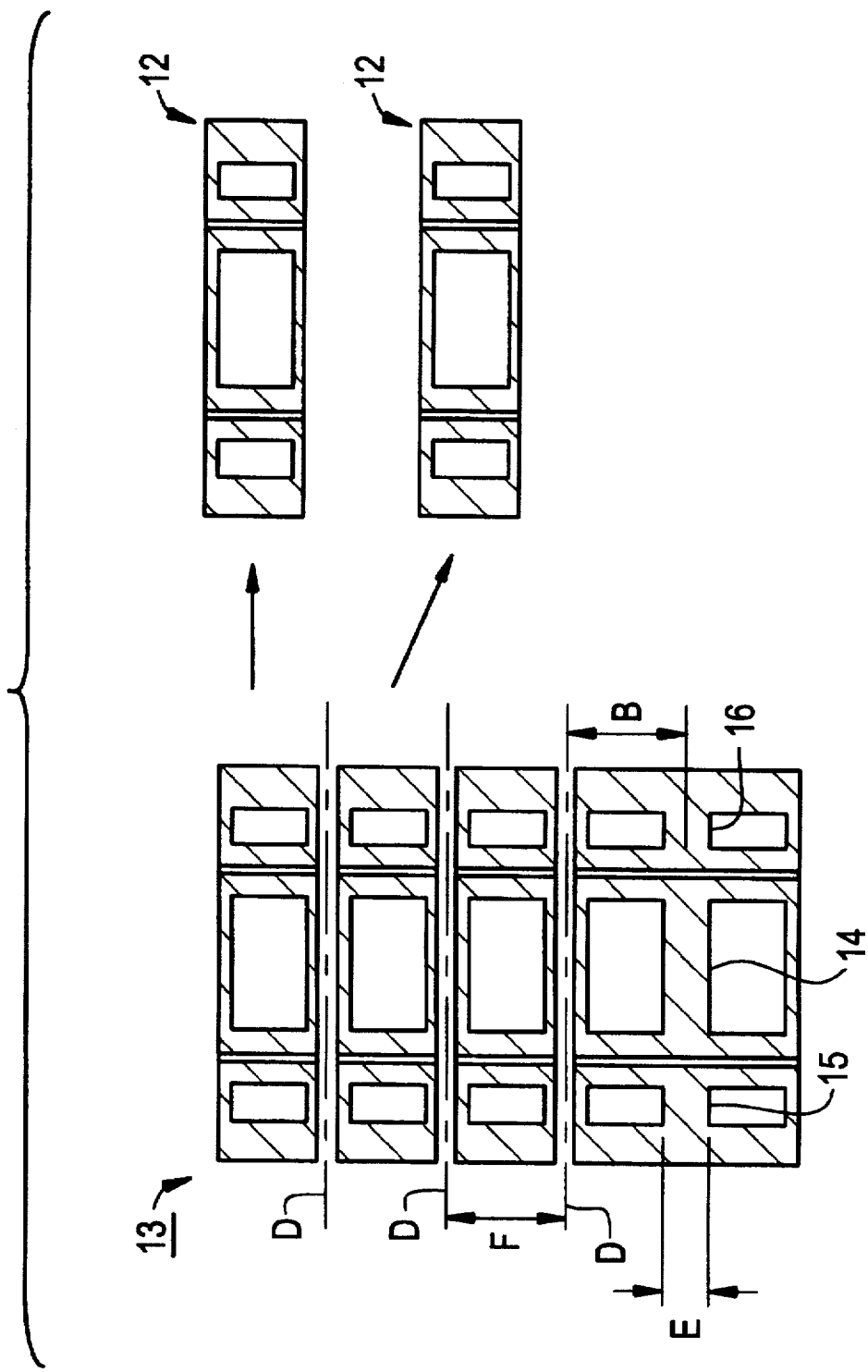
FIG. 5 is a plan diagram showing a model for explanation of a method of manufacturing the piezoelectric resonator shown in FIG. 4.

One example of a manufacturing method according to preferred embodiments of the present invention for making a piezoelectric resonator, such as the piezoelectric resonator 12 shown in FIG. 4 will be explained with reference to FIG. 5. When making the piezoelectric resonator 12, a mother plate 13 is prepared on which electrode structures for a plurality of piezoelectric resonators 12 are provided as shown in FIG. 5. Note here that at the left-hand part of FIG. 5, only the electrode structure on the mother plate 13 is shown. Also, a plurality of electrode structures each similar to that of the piezoelectric resonator 12 are provided on the bottom surface of the mother plate 13.

In the mother plate 13, the excitation-lead lines 5b, 5c are elongated to "bridge" between adjacent piezoelectric resonators 12 thus permitting formation of lead lines 14, each of which has a width "E" that is twice as large as the width of excitation-lead lines 5b, 5c plus a predefined cutting margin. The same configuration is used for the excitation-lead line $5a_1$ such that they are elongated and continuously coupled to the excitation-lead line $5a_2$ Of neighboring piezoelectric resonators 12 thus permitting formation of lead lines 15, each of which has a width that is twice the size of excitation-lead lines $5a_1$, $5a_2$ plus a specified cut margin. The excitation-lead line $5d_1$ is continuously coupled to the excitation-lead line $5d_2$ of neighboring piezoelectric resonators 12 permitting formation of lead lines 16, each of which has a width that is twice the size of the excitation-lead lines $5d_1$, $5d_2$ with a certain cut margin added thereto. The excitation-lead lines 14–16 are arranged to be repeated at a pitch B in the width direction of each piezoelectric resonator 12.

Next, the mother plate 13 is cut into portions along dash-and-dot lines D of FIG. 5. Each dash-and-dot line D extends through the center of the above-mentioned excitation-lead lines 14–16 in the width direction thereof thus rendering the cut pitch F identical in magnitude to the pitch B. As a result, since the lead lines 14–16 are cut along a center along the width thereof, the piezoelectric resonator 12 (FIG. 4) may be obtained which has the excitation-lead lines $5a_1$, $5a_2$, 5b, 5c, $5d_1$, $5d_2$ arranged to extend along portions of both longitudinal edges of the piezoelectric substrate 2 as shown at the right-hand part of FIG. 5.

More specifically, in the manufacturing method for the piezoelectric resonator 12 according to preferred embodiments of the present invention, it is possible to produce the piezoelectric resonator 12 so as to have significantly increased reliability by executing cutting processes with the pitch F substantially equal to the repetitive pitch B of the lead lines 14–16. In this case, while it is desirable that the pitch F for cutting is accurately identical to the repeat pitch B of the lead lines 14–16, the repeat pitch B and the cut pitch F will not always be exactly identical to each other as far as cutting is done within the width direction of the lead lines 14–16. Thus, the pitch F for cutting may be approximately equal to the pitch B.

The piezoelectric resonator 1 of the first preferred embodiment shown in FIG. 1 may be obtained by cutting the mother plate in a manner similar to that discussed above. Specifically, in the mother plate 13, the excitation-lead lines 15, 16 are replaced by the excitation-lead lines 5a, 5d shown in FIG. 1 which are arranged at respective piezoelectric resonator sections, for enabling the piezoelectric resonator 1 shown in FIG. 1 to be reliably obtained by cutting the mother plate 13 into portions along the width direction along lead lines 14.

Accordingly, even when the positional accuracy of lead lines 14 is slightly deviated, it is still possible to produce without failure the piezoelectric resonators 1, 12 having excitation-lead lines 5b, 5c extending along portions of the longitudinal edges of the piezoelectric substrate 2, as long as a cutting operation is executed along the width-direction of lead lines 14 during cutting processes.

Figure 6:
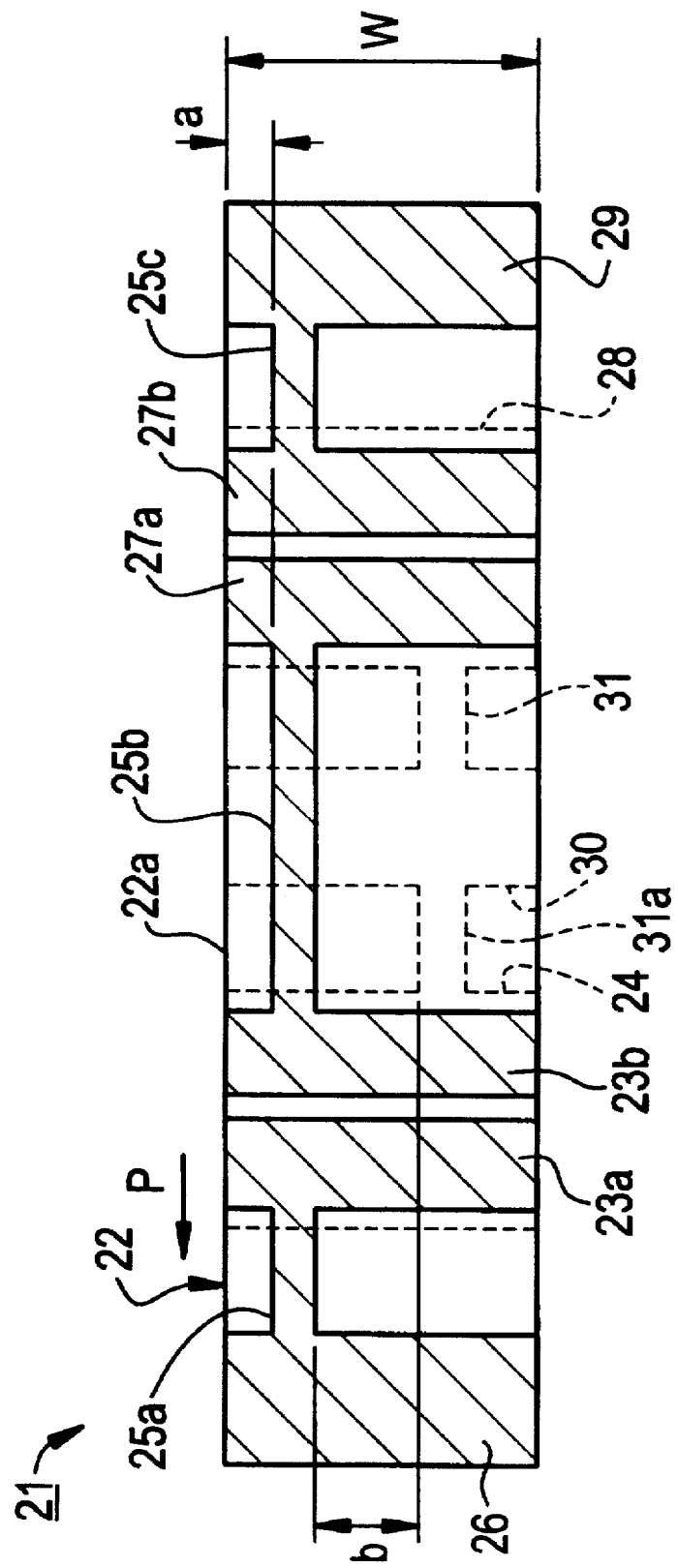
FIG. 6 is a diagram showing a plan view of a piezoelectric resonator in accordance with a second preferred embodiment.

FIG. 6 is a plan-view diagram for explanation of a piezoelectric resonator in accordance with a second preferred embodiment of the present invention. The illustrative piezoelectric resonator 21 preferably includes an elongated rectangular piezoelectric substrate 22. The piezoelectric substrate 22 is preferably made of piezoelectric ceramics such as, for example, lead zirconate titanate piezoelectric ceramics and is polarized in the lengthwise or longitudinal direction as designated by arrow P in FIG. 6. Note that the piezoelectric substrate 2 may alternatively be made of piezoelectric single-crystals such as quartz, LiTaO$_3$ or suitable materials other than the piezoelectric ceramics.

On the piezoelectric substrate 22, first and second excitation electrodes 23a, 23b are arranged so as to be spaced from each other via a gap in substantially the same way as in the piezoelectric resonator 1 of the first preferred embodiment. A first common electrode 24 is provided on the opposite surface, i.e. bottom surface of piezoelectric substrate 22, in a such manner that the electrode 24 is opposite to the excitation electrodes 23a, 23b with the piezoelectric substrate 22 located therebetween in the so-called "top/bottom-surface overlap" fashion. The excitation electrodes 23a, 23b and the first common electrode 24 constitute a first resonance section.

An excitation-lead line 25a is connected to the first excitation electrode 23a. The excitation-lead line 25a is electrically connected to a terminal electrode 26 located along one longitudinal end of the piezoelectric substrate 22. An excitation-lead line 25b is connected to the second excitation electrode 23b.

The excitation-lead line 25b is arranged to extend substantially parallel to a longitudinal edge 22a at a location spaced apart by a specified distance from the longitudinal edge 22a.

On the top surface (first major surface) of the piezoelectric substrate 22, third and fourth excitation electrodes 27a, 27b are provided at locations spaced by a specified distance from the first resonance section. The excitation-lead line 25b is connected to the third excitation electrode 27a.

A second common electrode 28 is arranged opposite to the excitation electrodes 27a, 27b with the piezoelectric substrate 22 located therebetween. The excitation electrodes 27a, 27b and the second common electrode 28 define a second resonance section.

An excitation-lead line 25c is connected to the fourth excitation electrode 27b. The excitation-lead line 25c is connected to a terminal electrode 29 which is provided on the opposite longitudinal end of the piezoelectric substrate 22.

On the bottom surface (second major surface) of the piezoelectric substrate 22, a ground-terminal electrode 30 is located at a central portion thereof. The ground-terminal electrode 30 is arranged to extend to reach both edges of the piezoelectric substrate 22 along the width thereof so that the terminal electrode partly overlaps the excitation-lead line 25b. Further, the ground-terminal electrode 30 is electrically connected by ground-lead lines 31a, 31b to the first and second common electrodes 24, 28.

One characteristic feature of the piezoelectric resonator 21 of this preferred embodiment is that, if a width of the piezoelectric substrate 22 is W, a thickness of the piezoelectric substrate 22 is t, the distance between the excitation-lead line 25b and edge 22a is a and the distance between the excitation-lead line 25b and the ground-lead lines 31a, 31b when viewed at right angles relative to the substrate surface is b, several major dimensions are carefully determined to satisfy the following expressions;

$$"0 \leq a \leq W/4" \quad (1)$$

$$"b \geq (\tfrac{2}{3})t" \quad (2)$$

In the piezoelectric resonator 21 of this preferred embodiment, it is possible to effectively suppress unnecessary ripples and spurious components in the attenuation-frequency characteristics because respective major dimensions thereof are selected to meet the expressions (1) and (2). This will be explained with reference to FIGS. 7 and 8 below.

An example of the piezoelectric resonator 21 with a center frequency of about 5.5 MHz was produced according to the design and features of the piezoelectric resonator of the second preferred embodiment. The example included a piezoelectric substrate 22 made of lead zirconate titanate piezoelectric ceramics and measuring about 8 mm in length, about 1.0 mm in width W, about 0.2 mm in thickness t, a=0.2 mm and b=0.3 mm.

For comparison, another piezoelectric resonator having a center frequency of about 5.5 MHz was manufactured according to the design of the prior art piezoelectric resonator, which may be similar to the piezoelectric resonator 21 of the second preferred embodiment except for the settings of a=0.4 mm and b=0.2 mm.

Figure 7:
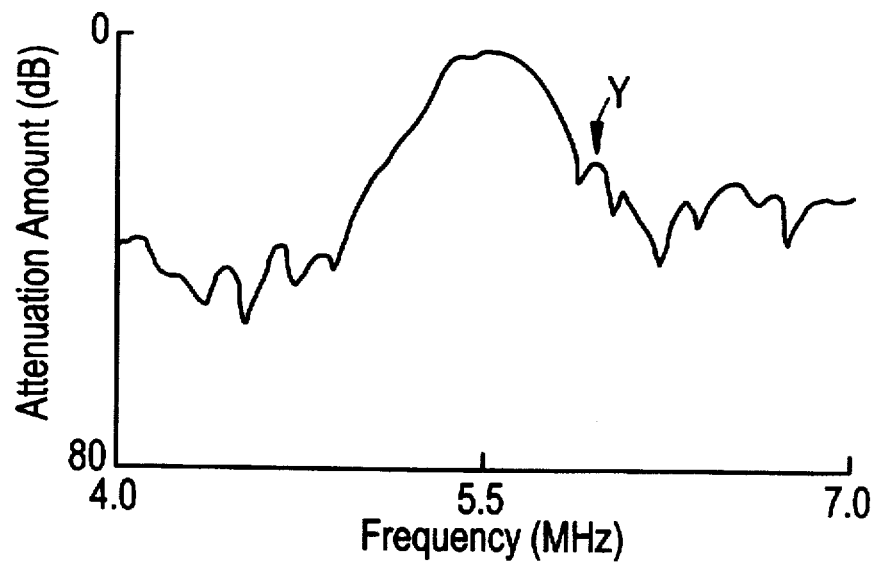
FIG. 7 is a diagram showing an attenuation-frequency characteristic of a prior art piezoelectric resonator for comparison to preferred embodiments of the present invention.

The attenuation-frequency characteristic of the prior art piezoelectric resonator thus prepared is shown in FIG. 7. The attenuation-frequency characteristic of the piezoelectric resonator of the second preferred embodiment is shown in FIG. 8.

Figure 8:
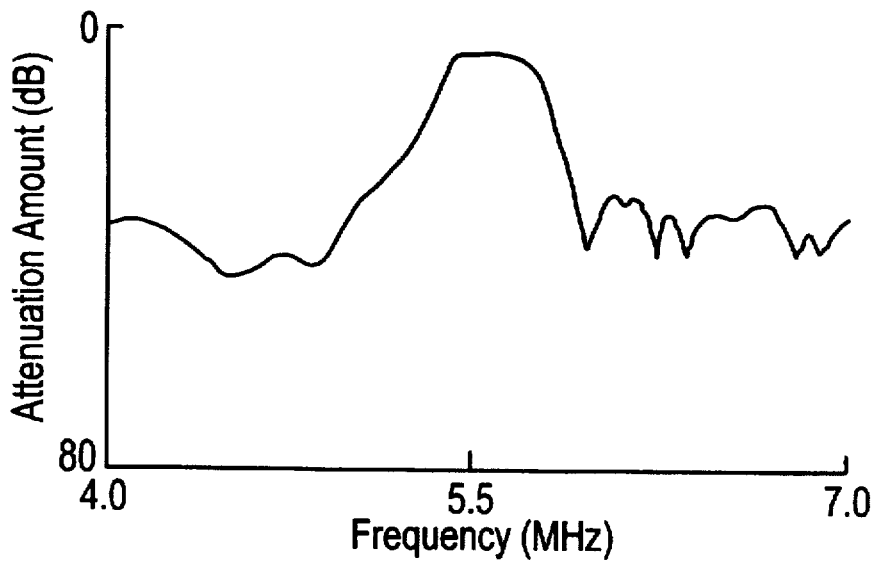
FIG. 8 is a diagram showing an attenuation-frequency characteristic of the piezoelectric resonator of the second preferred embodiment.

As apparent from FIG. 7, the prior art resonator has more than one spurious component in the vicinity of the pass band as designated by arrow "Y" whereas no such spurious components are produced in the characteristic of the piezoelectric resonator of the second preferred embodiment shown in FIG. 8.

It has been discovered and confirmed that by arranging and constructing the resonator so as to satisfy expressions (1) and (2) described above, the resonator effectively suppresses significant spurious components otherwise occurring near the pass band as shown in FIG. 8. This result is achieved based on the discovery that the generation frequency of spurious components denoted by arrow Y varies depending upon the distance a of the excitation-lead line 25b from the edge 22a and the further discovery that setting of a≦(¼)W causes spurious components generated by vibration of the lead line 25b to be removed from the nearby regions of the pass band while at the same time setting the dimension b at a carefully determined value greater than or equal to three-halves (3/2) of the thickness t to thereby suppress or weaken any affect of vibration of the lead line 25 thus enabling the spurious component indicated by Y to decrease in magnitude.

If the distance a is greater than the value (¼)W, then the spurious component designated by Y is located closer to adjacent regions of the pass band. When the distance b is less than 3/2 of the thickness t, the spurious indicated by Y is significantly increased.

It can thus be understandable that controlling the dimensions of the piezoelectric substrate 22 as well as the positions of the excitation-lead line 25b and ground-lead lines 31a, 31b so as to satisfy expressions (1) and (2) discussed previously may effectively suppress unnecessary vibration components otherwise occurring between the lead lines and the ground-terminal electrode 30 as well as between such lead lines and the ground-lead lines 31a, 31b, which in turn provides the piezoelectric resonator 21 with excellent filter characteristics.

Figure 9:
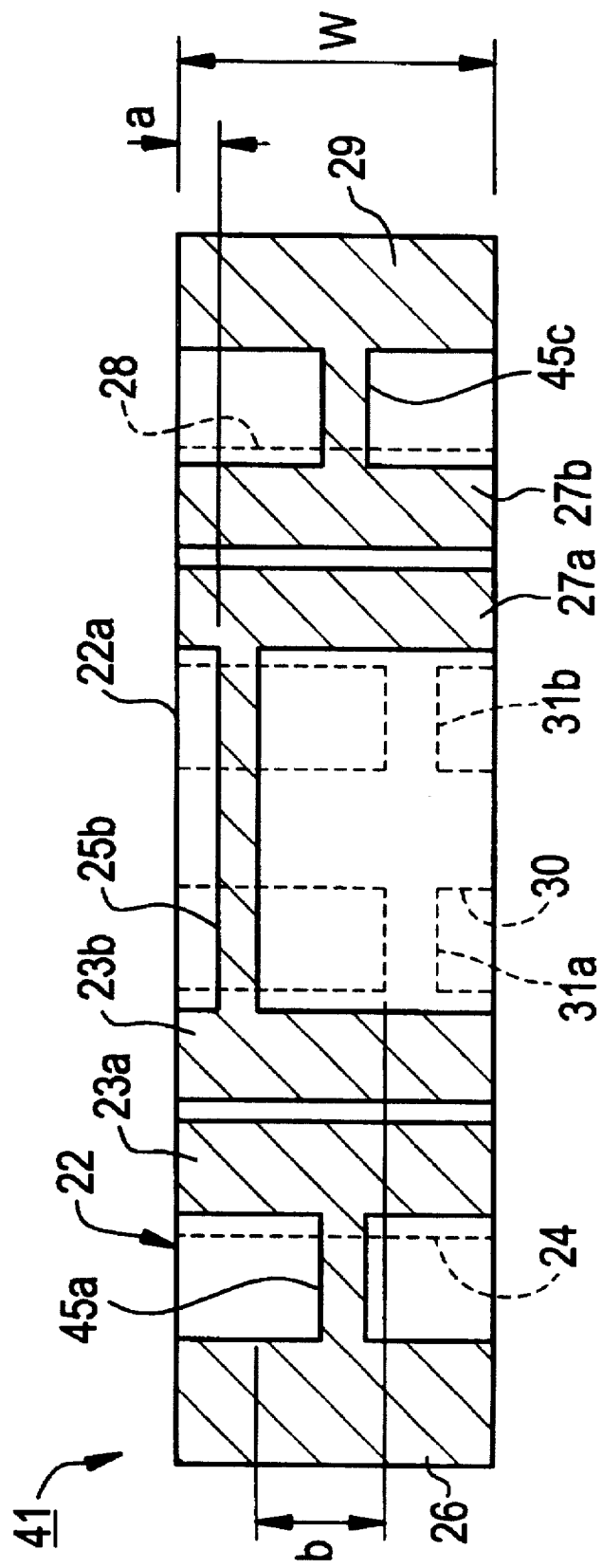
FIG. 9 is a plan diagram for explanation of a modification of the piezoelectric resonator of the second preferred embodiment.

FIG. 9 is a diagram showing a plan view of a piezoelectric resonator 41 in accordance with a modification of the piezoelectric resonator 21 of the second preferred embodiment. The piezoelectric resonator 41 is arranged such that excitation-lead lines 45a, 45c are disposed centrally along the width of the piezoelectric substrate 22. In other words, the excitation-lead line 25b alone is provided at the location spaced by the distance a from the edge 22a. The remaining portions of the resonator 41 are preferably designed substantially the same as the piezoelectric resonator 21. In this way, with the piezoelectric resonator in accordance with preferred embodiments of the invention, as long as the distance between the excitation-lead line 25b which partly overlaps the ground-terminal electrode 30 and the longitudinal edge of piezoelectric substrate 22 is set to satisfy the expressions (1) and (2) described above, the formation positions of the remaining excitation-lead lines 45a, 45c may be freely determined on a case-by-case basis.

Next, an explanation will be given of the capability to suppress unnecessary spurious components near the pass band with the piezoelectric resonator 41, based on practical examples which are described below.

An example of the piezoelectric resonator 41 including a filter having a center frequency of about 6 MHz was prepared. The piezoelectric substrate 22 was made of lead zirconate titanate piezoelectric ceramics and measuring about 8 mm in length, about 1.2 mm in width W, and about 0.19 mm in thickness t and distance a=0.2 mm and distance at b=0.4 mm. In this case, a=(⅙)W<(¼)W and b=(2.1) t and b>(3/2)t so that the resultant dimensions satisfied expressions (1) and (2).

For comparison, a filter having a center frequency of about 6 MHz was prepared according to a prior art design, which resonator used the same piezoelectric substrate and was similar to the above piezoelectric resonator 41 except for the settings of a=0.5 mm and b=0.2 mm.

Figure 10:
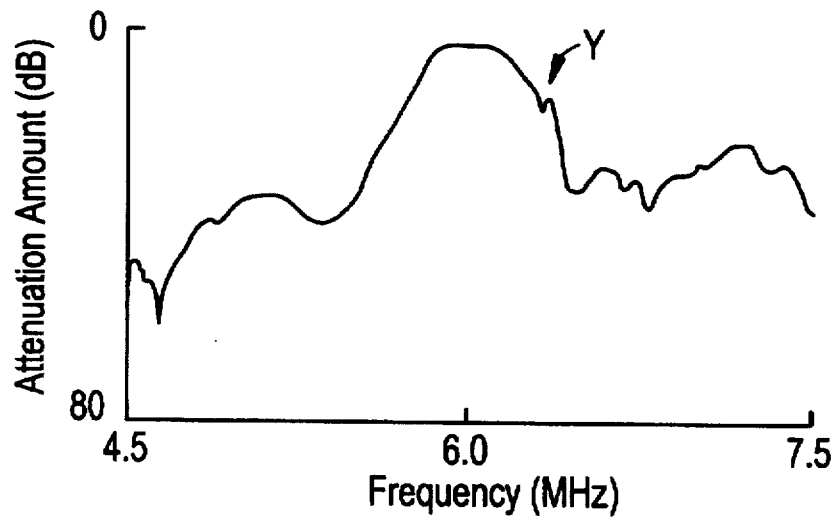
FIG. 10 is a diagram showing an attenuation-frequency characteristic of a prior art piezoelectric resonator.
Figure 11:
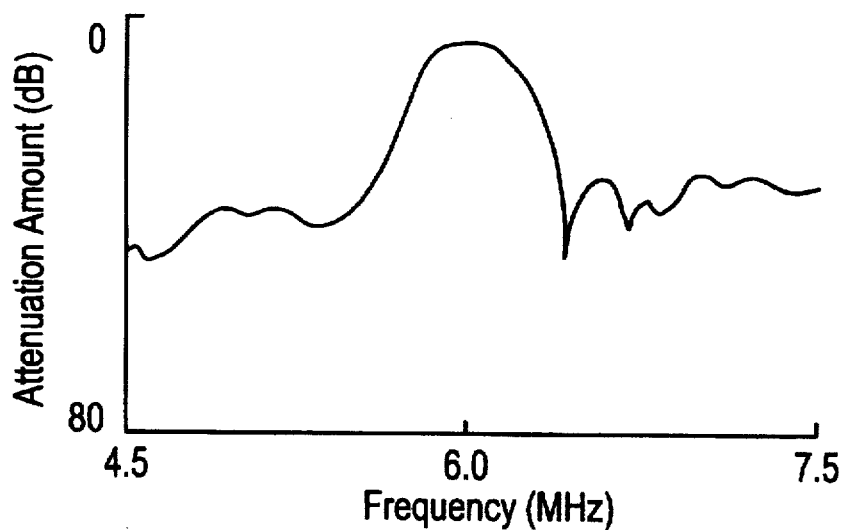
FIG. 11 is a diagram showing an attenuation-frequency characteristic of the piezoelectric resonator in accordance with the modification shown in FIG. 9.

The attenuation-frequency characteristic of the prior art product and that of the piezoelectric resonator 41 are shown in FIG. 10 and FIG. 11, respectively.

In the attenuation-frequency characteristic shown in FIG. 10, one spurious component designated by arrow Y is significantly generated near the pass band. In contrast, no such spurious components were observed or produced in the attenuation-frequency characteristic of the piezoelectric resonator 41 shown in FIG. 11.

In the piezoelectric resonator 1 in accordance with the first preferred embodiment, the two excitation-lead lines 5b, 5c are arranged to extend along portions of the lengthwise edges of the piezoelectric substrate 2. In the piezoelectric resonator 21 of the second preferred embodiment shown in FIG. 6, a single excitation-lead line 25b is disposed at the location spaced by the distance a from the edge 22a while setting the distance b to fall within a specific range.

In the present invention, preferably in the piezoelectric resonator 1 shown in FIG. 1, where the distance between one excitation-lead line 5c near the ground-lead lines 11a, 11b when viewed at right angles relative to the substrate surface, and the ground-lead lines 11a, 11b is represented by b, setting b>(3/2)t allows the piezoelectric resonator 1 to satisfy expressions (1), (2) since a=0.

In the manner described above, it is possible to obtain an excellent filter waveform that suppresses or eliminates unnecessary ripples and spurious components by setting the distance b so that it satisfies expressions (1) and (2) in the first piezoelectric resonator 1. This will be explained with reference to FIG. 12 and FIG. 13. In the piezoelectric resonator 1 shown in FIG. 1, a filter having a center frequency of about 4.5 MHz was prepared as one example of a preferred embodiment of the present invention. A piezoelectric substrate 2 was made of lead zirconate titanate piezoelectric ceramics and measured about 8 mm. in length, about 1.1 mm in width W, and about 0.25 mm in thickness t while setting the distance b at about 0.4 mm.

For comparison, a filter having a center frequency of about 4.5 MHz was prepared according to the prior art design, including the excitation-lead lines 55a, 55b, 55c centrally located along the width of the piezoelectric substrate as in the piezoelectric resonator 51 shown in FIG. 14 with the remaining configuration being similar thereto.

Figure 12:
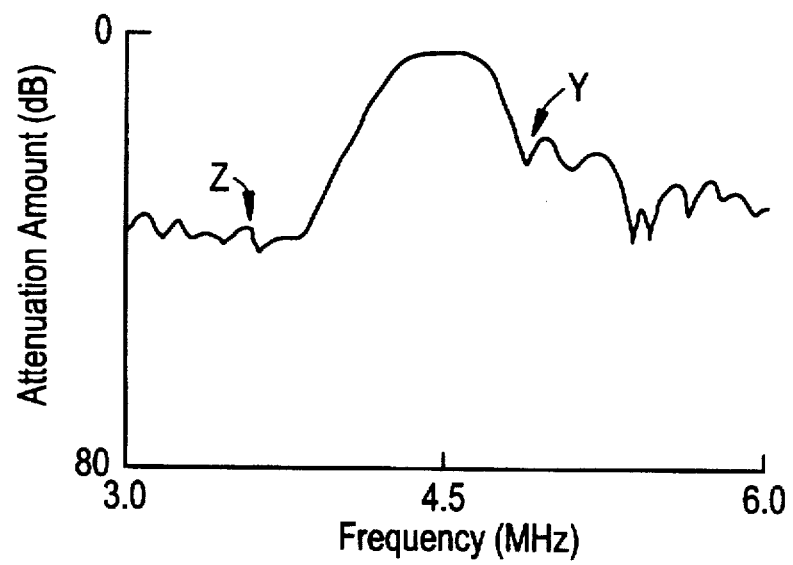
FIG. 12 is a diagram showing an attenuation-frequency characteristic of a prior art piezoelectric resonator.
Figure 13:
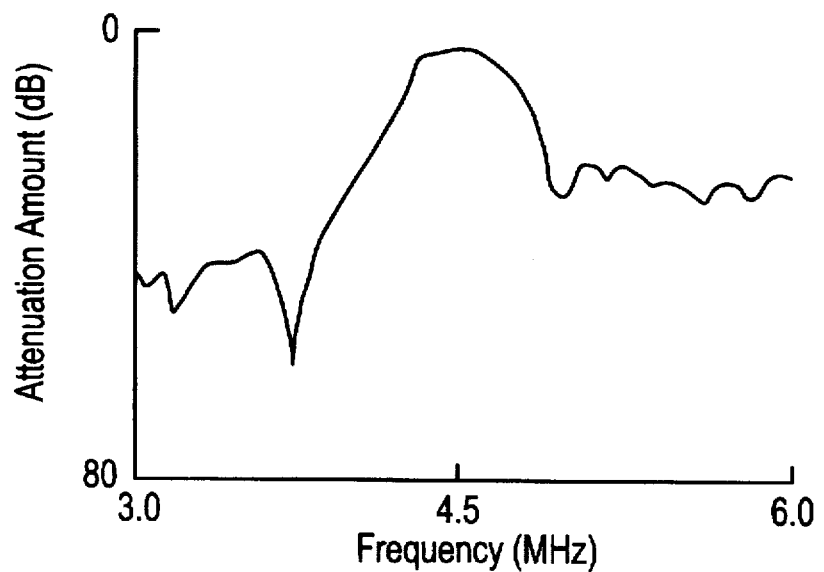
FIG. 13 is a diagram showing an attenuation-frequency characteristic in the case where a piezoelectric resonator in accordance with a first preferred embodiment of the invention is configured to satisfy the expressions (1) and (2).

The attenuation-frequency characteristic of the prior art product thus prepared is shown in FIG. 12 whereas the attenuation-frequency characteristic of the piezoelectric resonator of the example of a preferred embodiment of this invention is shown in FIG. 13.

When comparing FIGS. 12 and 13, it may be seen that in FIG. 12 one significant spurious component designated by arrow Y is generated while rendering the attenuation amount less in the vicinity of the pass band and further causing an additional spurious component denoted by arrow Z to be generated on a lower region side. In contrast thereto, in the attenuation-frequency characteristic shown in FIG. 13, almost no spurious components are observed or produced which produces improvement in the shape factor.

Although in the illustrative preferred embodiments each of the resonators includes first and second resonance sections, the piezoelectric resonators in accordance with the present invention may be such that the principles thereof may also be applicable to any piezoelectric resonators having only one resonance section including a common electrode arranged opposite the first and second resonance electrodes in the so-called top/bottom-surface overlap manner.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator, comprising:

a piezoelectric substrate having a pair of longitudinal edges extending along a length thereof and a pair of lateral edges extending along a width thereof;

first and second excitation electrodes provided on a first major surface of said piezoelectric substrate with a gap located therebetween;

first and second excitation-lead lines connected to said second excitation electrode, each of said first and second excitation-lead lines arranged to extend along at least a portion of at least one of the pair of longitudinal edges of the piezoelectric substrate;

a first common electrode provided on a second major surface of said piezoelectric substrate and disposed opposite to said first and second excitation electrodes with said piezoelectric substrate located therebetween;

a first ground-lead line connected to said first common electrode; and a ground-terminal electrode provided on the second major surface of said piezoelectric substrate, connected to said first ground-lead line and disposed opposite to said first and second excitation-lead lines with said piezoelectric substrate located therebetween.

2. The piezoelectric resonator according to claim 1, wherein said first excitation-lead line extends along at least a portion of a first one of said pair of longitudinal edges of said piezoelectric substrate and said second excitation-lead line extends along at least a portion of a second one of said pair of longitudinal edges of the piezoelectric substrate.

3. The piezoelectric resonator according to claim 1, wherein the piezoelectric substrate is polarized in a polarization direction and each of said first and second excitation-lead lines are arranged to extend along a direction that is substantially parallel to said polarization direction.

4. The piezoelectric resonator according to claim 1, wherein each of said first and second excitation-lead lines is arranged at a substantially central portion along the length of said piezoelectric substrate.

5. The piezoelectric resonator according to claim 1, further comprising third and fourth excitation electrodes provided on the first major surface of said piezoelectric substrate with a gap defined therebetween and at a distance from said first and second excitation electrodes;

a second common electrode is provided on the second major surface of said piezoelectric substrate and disposed opposite to said third and fourth excitation electrodes with said piezoelectric substrate located therebetween;

said second and third excitation electrodes are connected to each other via said first and second excitation-lead lines on the first major surface of said piezoelectric substrate; and a second ground-lead line arranged such that said second common electrode is connected to said ground-terminal electrode via said second ground-lead line.

6. The piezoelectric resonator according to claim 1, further comprising first and second terminal electrodes provided at first and second ends of said piezoelectric substrate, respectively.

7. The piezoelectric resonator according to claim 6, further comprising third and fourth excitation-lead lines provided on said first major surface of said piezoelectric substrate.

8. The piezoelectric resonator according to claim 7, wherein said third excitation-lead line is connected to said first terminal electrode and to said first excitation electrode and said fourth excitation-lead line is connected to said second terminal electrode and said fourth excitation electrode.

9. The piezoelectric resonator according to claim 8, wherein at least one of said third and fourth excitation-lead are arranged to extend along portions of at least one of said pair of longitudinal edges.

10. The piezoelectric resonator according to claim 8, wherein each of said third and fourth excitation-lead lines is arranged to extend along portions of a respective one of said pair of longitudinal edges.

11. The piezoelectric resonator according to claim 1, wherein the expressions "$0 \leq a \leq W/4$" and "$b \geq (\frac{1}{2})t$" are satisfied where "W", is the width of said piezoelectric substrate, "t" is a thickness of said piezoelectric substrate, "a" is a distance from one of said pair of longitudinal edges of said piezoelectric substrate to one of said first and second excitation-lead lines, and "b" is a distance between one of said first and second excitation-lead lines and said first ground-lead line when viewed at right angles relative to a plane corresponding to said substrate surface.

12. A piezoelectric resonator, comprising:

a piezoelectric substrate;

first and second excitation electrodes provided on a first major surface of said piezoelectric substrate with a gap defined therebetween;

an excitation-lead line connected to said second excitation electrode and extending in a direction substantially parallel to a length direction of said piezoelectric substrate;

a first common electrode provided on a second major surface of said piezoelectric substrate and disposed opposite to said first and second excitation electrodes with said piezoelectric substrate located therebetween;

a first ground-lead line connected to said first common electrode;

a ground-terminal electrode connected to said first ground-lead line and disposed opposite to said excitation-lead line with said piezoelectric substrate located therebetween; and the expressions "$0 \leq a \leq W/4$" and "$b \geq (\frac{1}{2})t$" being satisfied where "W" is a width of said piezoelectric substrate, "t" is a thickness of said piezoelectric substrate, "a" is a distance from an end edge extending in the length direction of said piezoelectric substrate to said excitation-lead line, and "b" is a distance between said excitation-lead line and said ground-lead line when viewed at right angles relative to a plane corresponding to said substrate surface.

13. The piezoelectric resonator according to claim 12, further comprising third and fourth excitation electrodes provided on the first major surface of said piezoelectric substrate with a gap defined therebetween and at a predetermined distance from said first and second excitation electrodes;

a second common electrode is provided on the second major surface of said piezoelectric substrate and disposed opposite to said third and fourth excitation electrodes with said piezoelectric substrate located therebetween;

said second and third excitation electrodes are connected to each other via said excitation-lead line on the first major surface of said piezoelectric substrate; and a second ground-lead line arranged such that said second common electrode is connected to said ground-terminal electrode via said second ground-lead line.

14. A method of manufacturing a piezoelectric resonator, comprising the steps of:

preparing a mother plate including a plurality of piezoelectric substrates each having a pair of longitudinal edges extending along a length thereof and a pair of lateral edges extending along a width thereof;

forming first and second excitation electrodes, first and second excitation-lead lines, a first common electrode, a first ground-lead line, and a ground-terminal electrode on each of said piezoelectric substrates such that for each of said piezoelectric substrates said first and second excitation electrodes are spaced from each other on a first major surface of said piezoelectric substrate, said first and second excitation-lead lines are connected to said second excitation electrode and each of said first and second excitation-lead lines arranged to extend along at least a portion of at least one of the pair of longitudinal edges of the piezoelectric substrate, said first common electrode is provided on a second major surface of said piezoelectric substrate and disposed opposite to said first and second excitation electrodes with said piezoelectric substrate located therebetween, said first ground-lead line is connected to said first common electrode; and said ground-terminal electrode is provided on the second major surface of said piezoelectric substrate and is connected to said first ground-lead line and disposed opposite to said first and second excitation-lead lines with said piezoelectric substrate located therebetween; and cutting said mother plate along the excitation-lead lines on said mother plate and along a direction of a length of said excitation-lead lines at a pitch which is substantially identical to a pitch of said excitation-lead lines.

15. The method according to claim 14, wherein said first excitation-lead line is formed to extend along at least a portion of a first one of said pair of longitudinal edges of each of said piezoelectric substrates and said second excitation-lead line is formed to extend along at least a portion of a second one of said pair of longitudinal edges of each of said piezoelectric substrates.

16. The method according to claim 14, wherein the piezoelectric substrate is polarized in a polarization direction and each of said first and second excitation-lead lines are arranged to extend along a direction that is substantially parallel to said polarization direction.

17. The method according to claim 14, wherein each of said first and second excitation-lead lines is arranged at a substantially central portion along the length of each of said piezoelectric substrates.

18. The method to claim 14, further comprising the steps of:

forming third and fourth excitation electrodes on the first major surface of each of said piezoelectric substrates with a gap defined therebetween and at a distance from said first and second excitation electrodes;

forming a second common electrode on the second major surface of each of said piezoelectric substrates and so as to be disposed opposite to said third and fourth excitation electrodes with a respective one of said piezoelectric substrates located therebetween;

arranging said second and third excitation electrodes so that they are connected to each other via said first and second excitation-lead lines on the first major surface of each of said piezoelectric substrates; and forming a second ground-lead line arranged such that said second common electrode is connected to said ground-terminal electrode via said second ground-lead line.

19. The method according to claim 14, further comprising the steps of:

forming first and second terminal electrodes at first and second ends of each of said piezoelectric substrates and third and fourth excitation-lead lines provided on said first major surface of each of said piezoelectric substrates and forming at least one of said third and fourth excitation lead-lines to extend along portions of at least one of said pair of longitudinal edges.

20. The method according to claim 14, further comprising the steps of forming first and second terminal electrodes at first and second ends of each of said piezoelectric substrates and third and fourth excitation-lead lines provided on said first major surface of each of said piezoelectric substrates and forming each of said third and fourth excitation lead-lines to extend along portions of a respective one of said pair of longitudinal edges.

* * * * *